United States Patent
Kearsley et al.

(10) Patent No.: US 10,530,977 B2
(45) Date of Patent: Jan. 7, 2020

(54) SYSTEMS AND METHODS FOR PLACING AN IMAGING TOOL IN A TEST AND MEASUREMENT TOOL

(71) Applicant: Fluke Corporation, Everett, WA (US)

(72) Inventors: Duncan N. Kearsley, Stanwood, WA (US); Paul A. Ringsrud, Langley, WA (US); Clark N. Huber, Everett, WA (US)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 15/262,873

(22) Filed: Sep. 12, 2016

(65) Prior Publication Data

US 2017/0078545 A1 Mar. 16, 2017

Related U.S. Application Data

(60) Provisional application No. 62/219,415, filed on Sep. 16, 2015.

(51) Int. Cl.
*H04N 7/18* (2006.01)
*H04N 5/225* (2006.01)
(Continued)

(52) U.S. Cl.
CPC .......... *H04N 5/2257* (2013.01); *G01R 15/14* (2013.01); *G01R 15/148* (2013.01);
(Continued)

(58) Field of Classification Search
CPC ...... G01J 5/08; G01J 5/02; G01J 5/025; G01J 5/0265; G01J 5/089; G01J 5/0893;
(Continued)

(56) References Cited

U.S. PATENT DOCUMENTS

| 4,467,279 A | 8/1984 | MacCormack |
| 4,954,094 A | 9/1990 | Humphrey |

(Continued)

FOREIGN PATENT DOCUMENTS

| CN | 1548967 A | 11/2004 |
| CN | 101617238 A | 12/2009 |

(Continued)

OTHER PUBLICATIONS

Extended European Search report for EP Application 16189325.0; dated May 19, 2017, 8 pages.
(Continued)

*Primary Examiner* — Masum Billah
(74) *Attorney, Agent, or Firm* — Fredrikson & Byron P.A.

(57) ABSTRACT

Analysis systems can include both a test and measurement tool for generating measurement data representative of at least one parameter of a device under test and an imaging tool for generating image data representative of a target scene. An electrical isolation mechanism can electrically isolate a user operating the analysis tool from the test and measurement circuit through the imaging tool. The electrical isolation mechanism can include an insulating coating surrounding a part of the imaging tool having an opening proximate the imaging tool so that electromagnetic radiation can enter through the opening and reach the imaging tool. The opening can be sized so that a standard finger cannot penetrate the opening to within a predetermined distance of the imaging tool. Additionally or alternatively, a window positioned over the opening can prevent access to the imaging tool via the opening.

13 Claims, 5 Drawing Sheets

(51) Int. Cl.
  *G01R 15/14* (2006.01)
  *H04N 5/33* (2006.01)
  *G01R 15/12* (2006.01)
  *G01R 1/04* (2006.01)

(52) U.S. Cl.
  CPC ............. *H04N 5/2252* (2013.01); *H04N 5/33* (2013.01); *G01R 1/04* (2013.01); *G01R 15/125* (2013.01)

(58) Field of Classification Search
  CPC ........ G01J 5/0896; G01J 5/026; G01J 5/0275; G01J 5/04; G01J 2005/0074; G01J 2005/0081
  USPC .......................................................... 348/61
  See application file for complete search history.

(56) References Cited

U.S. PATENT DOCUMENTS

| | | |
|---|---|---|
| 5,065,249 A | 11/1991 | Horn et al. |
| 5,500,786 A | 3/1996 | Ono |
| 5,844,719 A | 12/1998 | Wada |
| 6,095,682 A | 8/2000 | Hollander et al. |
| 7,535,002 B2 | 5/2009 | Johnson et al. |
| 7,810,001 B2 | 10/2010 | Zhou et al. |
| 7,851,758 B1* | 12/2010 | Scanlon .................... G01J 5/02 250/330 |
| 7,994,480 B2 | 8/2011 | Johnson et al. |
| 8,097,857 B2 | 1/2012 | Cochran et al. |
| 8,186,873 B1 | 5/2012 | Madding |
| 8,186,876 B2 | 5/2012 | Mullin et al. |
| 8,208,026 B2 | 6/2012 | Hogasten et al. |
| 8,274,273 B2 | 9/2012 | Nguyen et al. |
| 8,289,372 B2 | 10/2012 | Hamrelius et al. |
| 8,374,438 B1 | 2/2013 | Wagner |
| 8,520,970 B2 | 8/2013 | Strandemar |
| 8,620,841 B1 | 12/2013 | Filson et al. |
| 8,749,635 B2 | 6/2014 | Hogasten et al. |
| 8,803,698 B1 | 8/2014 | Heydron |
| 9,058,653 B1 | 6/2015 | Kostrzewa et al. |
| 9,143,703 B2 | 9/2015 | Boulanger et al. |
| 9,235,023 B2 | 1/2016 | Burt et al. |
| 9,264,154 B1 | 2/2016 | Laun |
| 9,473,681 B2 | 10/2016 | Hoelter et al. |
| 9,509,924 B2 | 11/2016 | Terre et al. |
| 2002/0001032 A1* | 1/2002 | Ohki ....................... G01S 19/14 348/207.99 |
| 2002/0038205 A1 | 3/2002 | Gray et al. |
| 2003/0089183 A1 | 5/2003 | Jacobsen et al. |
| 2004/0004482 A1 | 1/2004 | Bouabdo et al. |
| 2004/0030524 A1 | 2/2004 | Jarrell et al. |
| 2004/0190586 A1 | 9/2004 | Lee |
| 2005/0107976 A1 | 5/2005 | Klijn et al. |
| 2005/0188290 A1 | 8/2005 | Motika et al. |
| 2005/0259715 A1 | 11/2005 | Lee et al. |
| 2005/0279172 A1 | 12/2005 | Schreier et al. |
| 2006/0012385 A1 | 1/2006 | Tsao et al. |
| 2006/0017821 A1 | 1/2006 | Garvey et al. |
| 2006/0043296 A1 | 3/2006 | Mian et al. |
| 2006/0046793 A1 | 3/2006 | Hamilton et al. |
| 2006/0066325 A1 | 3/2006 | McGinnis et al. |
| 2006/0150724 A1 | 7/2006 | Byrne |
| 2006/0282736 A1 | 12/2006 | Schroth et al. |
| 2007/0058164 A1 | 3/2007 | Shibata et al. |
| 2007/0087311 A1 | 4/2007 | Garvey et al. |
| 2007/0198226 A1 | 8/2007 | Lee |
| 2008/0026647 A1 | 1/2008 | Boehnlein et al. |
| 2008/0091470 A1 | 4/2008 | Muradia |
| 2008/0100253 A1 | 5/2008 | Kiyamura |
| 2008/0204034 A1 | 8/2008 | Blades |
| 2008/0295582 A1 | 12/2008 | Lee et al. |
| 2009/0097502 A1 | 4/2009 | Yamamoto |
| 2009/0141137 A1 | 6/2009 | Watanabe et al. |
| 2009/0158849 A1 | 6/2009 | Gregg et al. |
| 2009/0184244 A1 | 7/2009 | Drews et al. |
| 2009/0294666 A1 | 12/2009 | Hargel |
| 2010/0097057 A1 | 4/2010 | Karpen |
| 2010/0117885 A1 | 5/2010 | Holbrook et al. |
| 2010/0130838 A1 | 5/2010 | Kermani et al. |
| 2010/0148759 A1* | 6/2010 | Lagerberg .............. G01R 1/025 324/149 |
| 2010/0163730 A1 | 7/2010 | Schmidt et al. |
| 2010/0164527 A1 | 7/2010 | Weyh et al. |
| 2010/0225299 A1 | 9/2010 | Nguyen et al. |
| 2010/0240317 A1 | 9/2010 | Giles et al. |
| 2011/0018987 A1 | 1/2011 | Doi |
| 2011/0096148 A1 | 4/2011 | Stratmann |
| 2011/0096168 A1 | 4/2011 | Siann et al. |
| 2011/0112701 A1 | 5/2011 | Johnson et al. |
| 2011/0122251 A1 | 5/2011 | Schmidt |
| 2011/0154999 A1 | 6/2011 | Schoch |
| 2011/0185048 A1 | 7/2011 | Yew et al. |
| 2011/0239794 A1 | 10/2011 | Krapf et al. |
| 2011/0273556 A1* | 11/2011 | Lyons ................ G02B 23/2484 348/85 |
| 2012/0001768 A1 | 1/2012 | Radosavljevic et al. |
| 2012/0019281 A1 | 1/2012 | Barbour, II |
| 2012/0038458 A1 | 2/2012 | Toepke et al. |
| 2012/0038760 A1 | 2/2012 | Kantzes et al. |
| 2012/0154172 A1 | 6/2012 | O'Hara et al. |
| 2012/0206129 A1 | 8/2012 | Mahan et al. |
| 2012/0244290 A1 | 9/2012 | Mullin et al. |
| 2012/0276867 A1 | 11/2012 | McNamee et al. |
| 2012/0314086 A1 | 12/2012 | Hubel et al. |
| 2012/0320189 A1 | 12/2012 | Stuart et al. |
| 2013/0006570 A1 | 1/2013 | Kaplan |
| 2013/0010287 A1 | 1/2013 | Tutton et al. |
| 2013/0028477 A1 | 1/2013 | Schmieder et al. |
| 2013/0057713 A1 | 3/2013 | Khawand |
| 2013/0078908 A1 | 3/2013 | Smith |
| 2013/0155249 A1 | 6/2013 | Neeley et al. |
| 2013/0155474 A1 | 6/2013 | Roach et al. |
| 2013/0162835 A1* | 6/2013 | Forland .............. H04N 5/23222 348/164 |
| 2013/0169799 A1 | 7/2013 | Hoelzl et al. |
| 2013/0176418 A1 | 7/2013 | Pandey et al. |
| 2013/0188058 A1 | 7/2013 | Nguyen et al. |
| 2013/0250102 A1 | 9/2013 | Scanlon et al. |
| 2013/0253551 A1 | 9/2013 | Boyle et al. |
| 2013/0278264 A1 | 10/2013 | Boskamp |
| 2013/0278771 A1 | 10/2013 | Magoun et al. |
| 2013/0286408 A1 | 10/2013 | Castillo et al. |
| 2013/0321621 A1 | 12/2013 | Menzel |
| 2013/0321641 A1 | 12/2013 | McManus et al. |
| 2013/0342680 A1 | 12/2013 | Zeng et al. |
| 2014/0002639 A1 | 1/2014 | Cheben et al. |
| 2014/0036068 A1 | 2/2014 | Nguyen et al. |
| 2014/0042319 A1 | 2/2014 | Pickett et al. |
| 2014/0058797 A1 | 2/2014 | Roy et al. |
| 2014/0062496 A1 | 3/2014 | Kwon et al. |
| 2014/0085459 A1 | 3/2014 | Blanton et al. |
| 2014/0104415 A1 | 4/2014 | Fox et al. |
| 2014/0119213 A1 | 5/2014 | Devarasetty |
| 2014/0176725 A1 | 6/2014 | Stuart et al. |
| 2014/0184810 A1 | 7/2014 | Sekiguchi |
| 2014/0219314 A1 | 8/2014 | Ryou |
| 2014/0253735 A1 | 9/2014 | Fox et al. |
| 2014/0266765 A1 | 9/2014 | Neeley et al. |
| 2014/0267753 A1 | 9/2014 | Epperson et al. |
| 2014/0267757 A1 | 9/2014 | Abramson et al. |
| 2014/0270546 A1 | 9/2014 | Neeley et al. |
| 2014/0278259 A1 | 9/2014 | Neeley et al. |
| 2014/0313325 A1 | 10/2014 | Buehler et al. |
| 2014/0327735 A1* | 11/2014 | Ruchet .................. G02B 6/385 348/40 |
| 2015/0054492 A1 | 2/2015 | Mende et al. |
| 2015/0063652 A1* | 3/2015 | Mangan ................ G06K 9/0014 382/110 |
| 2015/0170110 A1 | 6/2015 | Schluessel et al. |
| 2015/0185251 A1 | 7/2015 | Heydron et al. |
| 2015/0205135 A1 | 7/2015 | Border et al. |
| 2015/0269742 A1 | 9/2015 | Bergstrom et al. |
| 2015/0334225 A1 | 11/2015 | Bull et al. |

(56) References Cited

U.S. PATENT DOCUMENTS

| | | |
|---|---|---|
| 2015/0365598 A1 | 12/2015 | Tanaka et al. |
| 2015/0369730 A1 | 12/2015 | Schmidt et al. |
| 2016/0025799 A1 | 1/2016 | Stolper et al. |
| 2016/0076936 A1 | 3/2016 | Schoch et al. |
| 2016/0076937 A1 | 3/2016 | Stuart et al. |
| 2016/0076943 A1 | 3/2016 | Bohn et al. |
| 2016/0080666 A1 | 3/2016 | Stuart et al. |
| 2016/0080667 A1 | 3/2016 | Stuart et al. |
| 2016/0105810 A1 | 4/2016 | Khurana et al. |
| 2016/0105811 A1 | 4/2016 | Khurana et al. |
| 2016/0116309 A1 | 4/2016 | Silva et al. |
| 2016/0119592 A1 | 4/2016 | Stuart et al. |
| 2016/0131607 A1 | 5/2016 | Silva et al. |
| 2016/0173743 A1 | 6/2016 | Masarik |
| 2016/0223588 A1 | 8/2016 | Fox |
| 2016/0290869 A1* | 10/2016 | Frank .................. G01J 5/048 |
| 2016/0300341 A1 | 10/2016 | Hay et al. |
| 2017/0061663 A1 | 3/2017 | Johnson et al. |
| 2017/0078544 A1 | 3/2017 | Ringsrud et al. |
| 2017/0111258 A1 | 4/2017 | Bezold et al. |
| 2017/0116725 A1 | 4/2017 | Stuart et al. |
| 2017/0140520 A1 | 5/2017 | Stuart et al. |

FOREIGN PATENT DOCUMENTS

| | | |
|---|---|---|
| CN | 101672864 A | 3/2010 |
| CN | 103606276 A | 2/2014 |
| CN | 103760448 A | 4/2014 |
| CN | 104049122 A | 9/2014 |
| DE | 102004007314 A1 | 8/2005 |
| EP | 2230605 A1 | 9/2010 |
| EP | 2570879 A2 | 3/2013 |
| EP | 2683146 A1 | 1/2014 |
| EP | 2684731 A1 | 1/2014 |
| EP | 2778628 A2 | 9/2014 |
| JP | 2008232637 A | 10/2008 |
| WO | 0203029 A1 | 1/2002 |
| WO | 2011131758 A1 | 10/2011 |
| WO | 2012170941 A1 | 12/2012 |
| WO | 2012170946 A2 | 12/2012 |
| WO | 2012170949 A2 | 12/2012 |
| WO | 2012170953 A2 | 12/2012 |
| WO | 2012170954 A2 | 12/2012 |
| WO | 2013052196 A1 | 4/2013 |
| WO | 2013052383 A1 | 4/2013 |
| WO | 2014012070 A1 | 1/2014 |
| WO | 2014043592 A2 | 3/2014 |
| WO | 2014082097 A1 | 5/2014 |
| WO | 2014085699 A1 | 6/2014 |
| WO | 2014093721 A2 | 6/2014 |
| WO | 2014093724 A1 | 6/2014 |
| WO | 2014170306 A1 | 10/2014 |

OTHER PUBLICATIONS

1587 FC/1587/1577 Insulation Multimeter, User's Manual, Apr. 2005, 50 pages.

Fluke 3000 FC Series Test Tools Fluke, Mar. 31, 2014, Retrieved from URL: http://www.mouser.com/catalog/specsheets/Fluke; 12 pages.

Fluke Connect TM Wi-Fi Connection to Thermal Imager, May 31, 2014, Retrieved from URL: http://www.bergeng.com/mm5/downloads/fluke/FC_ti90_qreng000.pdf; 2 pages.

Fluke Corporation, "Measuring from a Safe Distance from the Fluke Connect app," 1 page, May 12, 2014, URL: https://www.youtube.com/wach.

Son et al., "Vibration displacement measurement technology for cylindrical structures using camera images," Nuclear Engineering and Technology, vol. 47, No. 4, Mar. 27, 2015, pp. 488-499.

Ti125, Ti110, Ti105, Ti100, Ti95, and Ti90 Industrial-Commercial Imagers, May 31, 2014, Retrieved from URL: http://www.farnell.com/datasheets/1829789.pdf; 4 pages.

U.S. Appl. No. 15/190,792, filed Jun. 23, 2016, and entitled Thermal Anomaly Detection, 61 pages.

U.S. Appl. No. 15/262,820, entitled "Electrical Isolation for a Camera in a Test and Measurement Tool", filed Sep. 12, 2016, 26 pages.

Li et al., "A Machine Vision Method for the Measurement of Vibration Amplitude," Meas. Sci. Technol., vol. 18, 2007, 11 pages.

Guoxiong et al., "Measurement and Control Circuit," China Machine Press, Version 3, Mar. 2008, Section 2.3, with partial English translation, 6 pages.

* cited by examiner

SYSTEMS AND METHODS FOR PLACING AN IMAGING TOOL IN A TEST AND MEASUREMENT TOOL

CROSS-REFERENCES

This application claims the benefit of U.S. Provisional Application No. 62/219,415, filed Sep. 16, 2015, the content of which is hereby incorporated by reference in its entirety.

TECHNICAL FIELD

This disclosure generally relates to electrical test tools capable of withstanding high voltages and associated imaging tools.

BACKGROUND

Various information regarding parameters of system components may be useful in analyzing individual component's performance, operating conditions, lifespan, and other various aspects. Some such information includes measurable quantities, such as a current, voltage, power, impedance, vibration, and the like. Analysis of components of a system may provide insight into ways the system may be improved, for example, by repairing or replacing faulty or otherwise non-optimal components. Various test and measurement tools are capable of performing such measurements, and are often used in analyzing such components.

In some instances, when analyzing electrical equipment, dangerously high voltages may at times be present in various parts of the circuit in the analysis instrument. Standards and practices exist to protect users from being exposed to these voltages, such as solid insulation between any potentially high voltage portions and the user.

In some examples, additional information may be helpful in analyzing such components. For example, imaging techniques, such as infrared imaging, may provide useful additional information. Infrared imagery of a system or components thereof can provide thermal patterns of the scene, highlighting temperature abnormalities in system components. Such imagery may be useful in diagnosing similar or different issues that may be detected or otherwise analyzed using standard test and measurement tools as discussed above.

Since the advent of thermal imaging applications in electrical environments, there has been a need to keep the operator at a safe distance from the electrical circuits under observation. In some situations, companies have developed optical windows for switch gear cabinets, enabling physical isolation from the high voltage, but allowing optical measurements.

In the event that a user is performing both imaging and other analysis (e.g., electrical measurement analysis), instances may occur in which the imaging apparatus is exposed to or proximate potentially high voltage environments. Thus, additional safety measures may be necessary for protecting the user from exposure to potentially dangerous signals via the imaging apparatus.

SUMMARY

Aspects of this disclosure are directed toward systems and methods for providing combined test and measurement analysis and imaging analysis while providing adequate safety to a user. Embodiments in this disclosure include systems comprising a test and measurement tool comprising a test and measurement circuit and being configured to generate measurement data representative of at least one parameter of an object under test. A system can further include an imaging tool configured to generate image data representative of a target scene. In various embodiments, the imaging tool can include an infrared (IR) imaging tool and/or a visible light (VL) imaging tool.

Exemplary systems can include a housing enclosing the test and measurement tool and the imaging tool and can include an aperture permitting electromagnetic radiation to enter the housing so that the imaging tool receives the electromagnetic radiation. The system can include at least one electrical isolation mechanism configured and arranged so that a user operating the analysis tool is electrically isolated from the test and measurement circuit through the imaging tool.

In some examples, the electrical isolation mechanism includes an insulating coating surrounding at least a portion of the imaging tool and having an opening proximate the imaging tool. In some such examples, electromagnetic radiation can enter the opening and reach the imaging tool. However, in some embodiments, the opening in the insulating coating is sized so that a standard finger cannot penetrate the opening to within a predetermined distance of the imaging tool.

In some examples, the standard finger and the predetermined distance meet IEC 61010 standards. For instance in some embodiments, the opening prevents an object of standard dimensions (e.g., as defined by the IEC) from reaching within the predetermined distance of the imaging tool. The predetermined distance can be based, for example, on a maximum voltage rating of the test and measurement circuit.

Additionally or alternatively, in some examples, the system includes a window substantially covering the opening in the coating. The window can prevent the user (e.g., the finger of a user) from entering the housing and coming within a predetermined distance of the imaging tool. In some such embodiments, the window can provide electrically insulating properties to at least partially protect the user from electrical shocks from the imaging tool. Thus, in some such examples, the predetermined distance in embodiments including such a window can be less than the predetermined distance in embodiments not including the window.

The details of one or more examples are set forth in the accompanying drawings and the description below. Other features, objects, and advantages will be apparent from the description and drawings, and from the claims.

DETAILED DESCRIPTION

Aspects of the disclosure generally relate to systems and methods providing electrical isolation for user safety in combination imaging and test and measurement tools. Test and measurement tools can be generally capable of determining at least one parameter of a device under test. Exemplary test and measurement tools can include, but are not limited to, digital multimeters, current measurement tools, power quality tools, vibration tools, portable oscilloscope tools, laser alignment tools, ultrasonic test tools, insulation resistance testers, multi-function electrical test tools, single-function electrical test tools, contact temperature measurement tools, humidity measurement tools, airflow measurement tools, air temperature measurement tools, air quality and particulate measurement tools, and the like. In some embodiments, one or more such test and measurement tools can produce and/or measure an electrical signal that is unsafe for the operator of the test and measurement tool without proper protection.

One or more imaging devices can be integrated with or otherwise attached or attachable to a test and measurement tool such as described in U.S. patent application Ser. No. 14/855,884 entitled "TEST AND MEASUREMENT SYSTEM WITH REMOVABLE IMAGING TOOL," now published as U.S. Patent Publication No. 2016/0080666, or U.S. patent application Ser. No. 14/855,844 entitled "METHOD OF ATTACHING CAMERA OR IMAGING SENSOR TO TEST AND MEASUREMENT TOOLS," now published as U.S. Patent Publication No. 2016/0076936, each of which was filed Sep. 16, 2015, is assigned to the assignee of the instant application, and is hereby incorporated by reference in its entirety. In various examples, the imaging tool interfacing with a test and measurement tool can be sensitive to any of a variety of wavelengths. Exemplary imaging components can include sensors which can detect visible, near infrared (NIR), short-wavelength infrared (SWIR), long wavelength infrared (LWIR), terahertz (THz), ultraviolet (UV), X-Ray or other wavelengths. In some embodiments, the imaging component can include one or more imaging sensors, for example, infrared (IR) and visible light (VL) cameras.

Figure 1B:
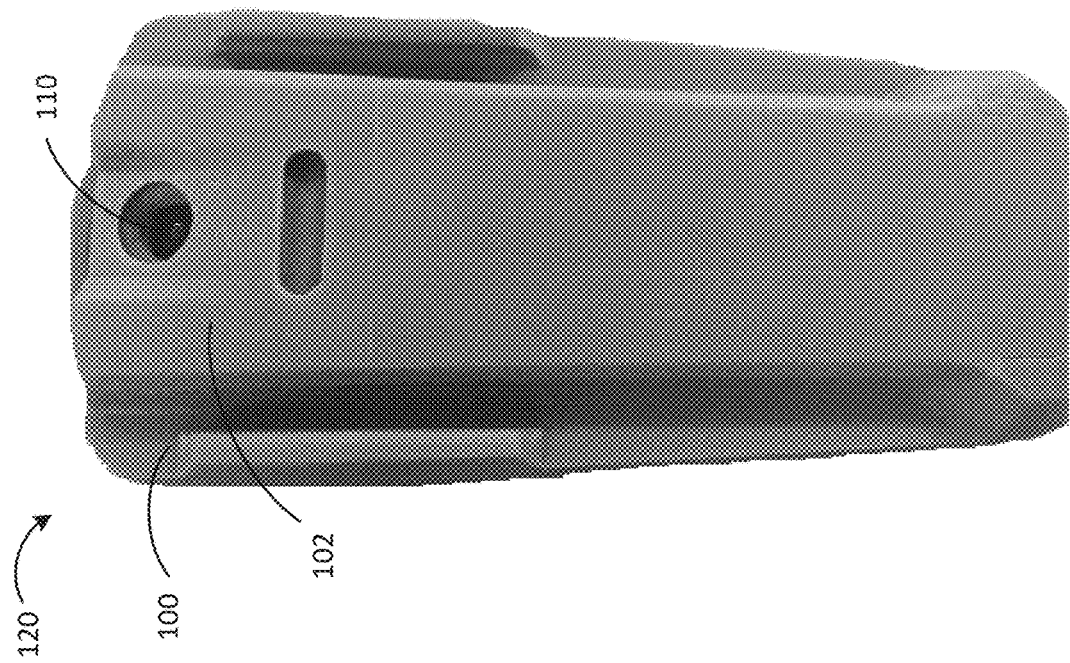
FIGS. 1A and 1B provide front and back views of an exemplary system including a test and measurement tool and an imaging tool.
Figure 1A:
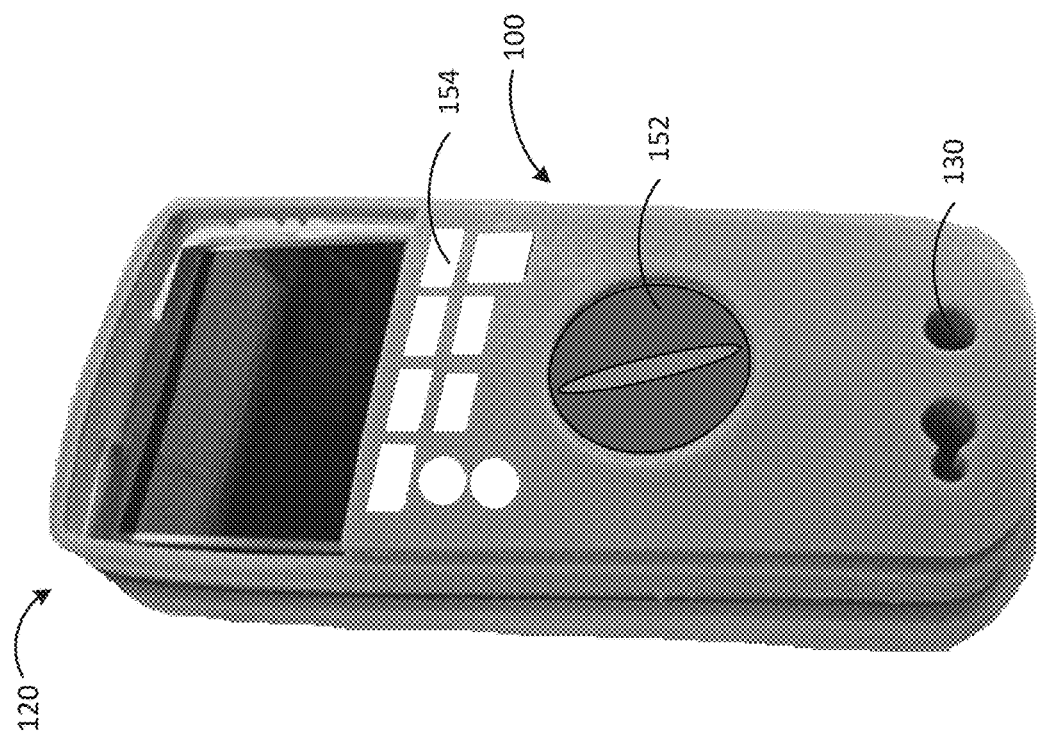

FIGS. 1A and 1B provide front and back views of an exemplary system including a test and measurement tool and an imaging tool. The embodiment of FIGS. 1A and 1B includes a test and measurement tool 100 and an imaging tool 110 combined into a single combination tool 120. In the illustrated embodiment, test and measurement tool 100 includes a back surface 102 through which the imaging tool 110 receives radiation from a target scene.

In some examples, imaging tool 110 can include a plurality of sensing components. For example, imaging tool 110 may include one or both of an infrared (IR) camera and a visible light (VL) camera. It will be appreciated that various imaging tools such as 110 can include any combination of appropriate sensors capable of detecting a variety of wavelengths.

In the example of FIGS. 1A and 1B, imaging tool 110 is integrated into test and measurement tool 100. That is, the system of FIG. 1 shows a combination tool 120 having integral test and measurement tool 100 and imaging tool 110. Imaging tool 110 includes a camera capable of detecting radiation in one or more ranges of wavelengths. As described, imaging tool 110 may include a plurality of cameras for detecting radiation in different wavelength spectrums. In some examples, the imaging tool may include a plurality of sensor arrays, each sensor array sensitive to a different range of wavelengths. Some such embodiments include optics for separating light incident to imaging tool and substantially directing light within certain wavelength ranges to corresponding sensor arrays.

The combination tool 120 of FIGS. 1A and 1B may be configured to generate image data and measurement data substantially simultaneously. In some examples, combination tool 120 includes a display 108 capable of presenting one or more of image data, measurement data, or other information. Additionally or alternatively, any one or more of the test and measurement tool 100, imaging tool 110, and combination tool 120 can communicate one or more of measurement data, image data, or combined measurement and image data to any other system component. In some examples, such data may be communicated to an external device, as described in U.S. patent application Ser. No. 14/855,989, filed Sep. 16, 2015, entitled "DISPLAY OF IMAGES FROM AN IMAGING TOOL EMBEDDED OR ATTACHED TO A TEST AND MEASUREMENT TOOL," now published as U.S. Patent Publication No. 2016/0076937, which is assigned to the assignee of the instant application, and which is hereby incorporated by reference in its entirety.

In the front view of FIG. 1A, the tool 120 includes inputs 130, for example, for receiving one or more accessories (e.g., test leads). The one or more accessories can be used for interfacing with an object under test for generating measurement data representative of at least one parameter of a device under test. In some embodiments, test and measurement tool 100 in combination tool 120 may perform a plurality of different measurement functions via inputs 130. In some embodiments, the measurement function is selectable, for example, via a user interface 150. Interface 150 can include one or more elements by which a user can interact with the tool 120, such as a selection knob 152 or buttons 154, or other interface elements such as a touchscreen, switches, and the like.

Combination tool 120 includes a display 108. Display 108 can be used to present various information to the user. In some examples, display 108 can be configured to present measurement data generated by the test and measurement tool 100. Additionally or alternatively, the display 108 can be configured to present image data generated by imaging tool 110. In some embodiments, a combination of measurement data and image data can be presented on the display 108 for presentation to a user.

Figure 2:
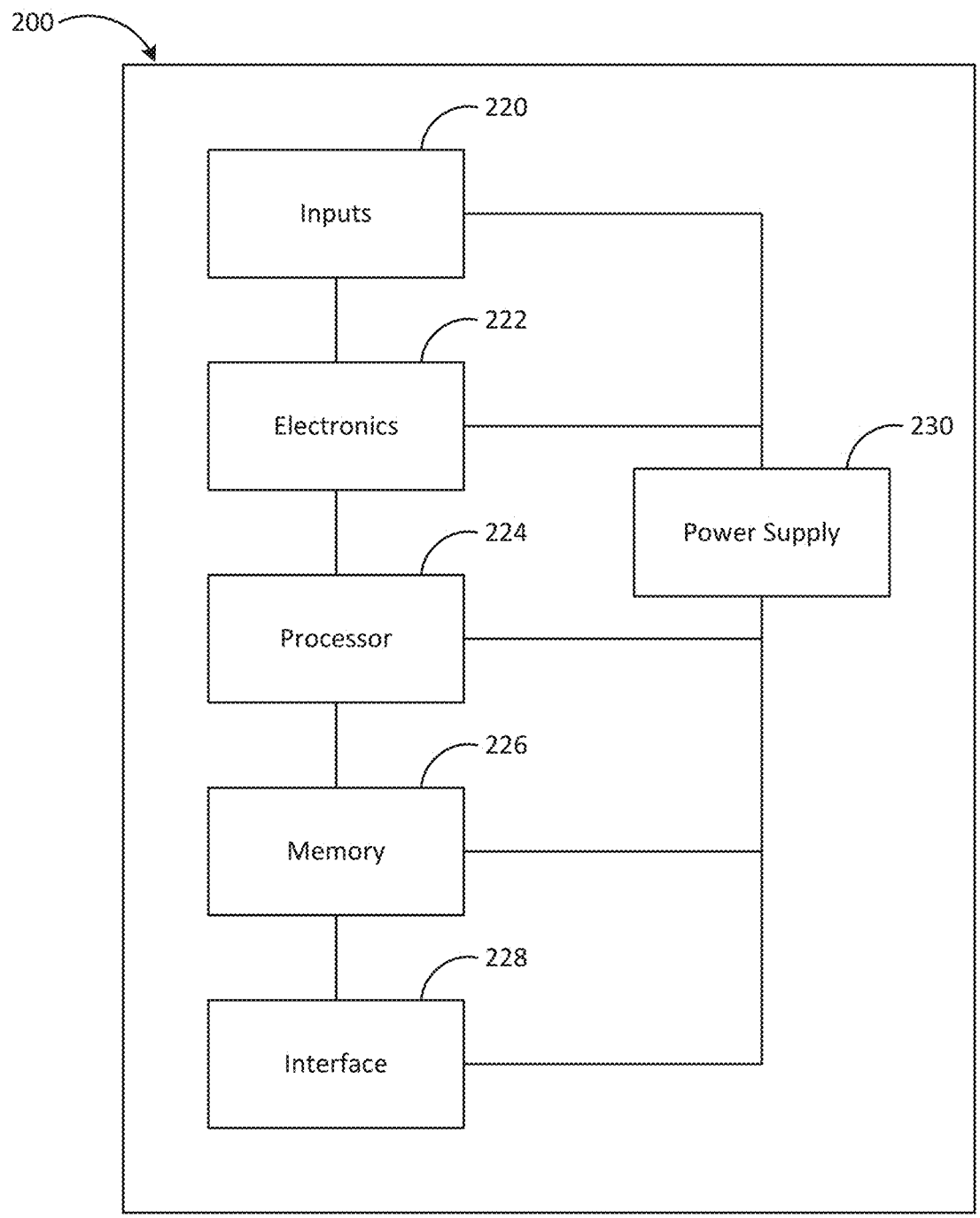
FIG. 2 is an exemplary schematic diagram of a test and measurement tool comprising a variety of components.

FIG. 2 is an exemplary schematic diagram of a test and measurement tool comprising a variety of components. In the illustrated example, the test and measurement tool 200 may include one or power supplies 230 for providing electrical power to any of a variety of system components for performing a variety of tasks, such a performing one or more primary functions. In some embodiments, the one or more power supplies 230 may include one or more batteries. Additionally or alternatively, the test and measurement tool 200 may be capable of running on AC power, e.g., from a standard wall receptacle. In some such embodiments, one or more batteries of the test and measurement tool 200 may be charged while the tool 200 is operating on or otherwise plugged into an AC power source.

The test and measurement tool may include one or more inputs 220 configured to interface with an object under test for performing a measurement of a parameter thereof. In various examples, the one or more inputs 220 may include any appropriate input for performing a measurement of a parameter of a device under test. The one or more inputs 220 may provide a signal indicative the parameter of the object under test to any combination of electronics 222 and a processor 224 for further processing of the signal. In some examples, the test and measurement tool 200 includes a memory 226 for storing information indicative of one or more parameters of a device under test. In some embodiments, one or both of processor 224 and memory 226 may be integrated into electronics 222.

In some embodiments, test and measurement tool 200 may include an interface 228 for interacting with a user. In some examples, interface 228 may include one or more controls for receiving user inputs. Controls may include, for example, buttons, switches, knobs, touch screens, etc. In some embodiments, a user may initiate a measurement or other test and measurement tool 200 function using controls. Additionally or alternatively, the interface may include a display for communicating information to a user. For example, the display may present a user with selectable options, such as various functions selectable by the user via controls. Additionally or alternatively, the display may be configured to present the results of one or more measurements performed by the test and measurement tool for observation by a user. In some examples, a display is capable of presenting textual measurement information (e.g., letters, numbers, etc.), but is not capable of displaying image information, such as described elsewhere herein. Additionally or alternatively, in some embodiments, power supply 230 is not capable of supporting a continuous image display without severely depleting the available power supply. Thus, in some examples, presentation of image data via interface 228 may be impossible or impractical.

In some examples, interface 228 may provide an interface with additional equipment. For example, in some embodiments, interface 228 can provide a communication interface between the test and measurement tool 200 and an imaging tool (e.g., 110) or an external device (e.g., smartphone, tablet, etc.). In various embodiments, interface 228 can be used to export received measurement data, such as from inputs 220, or a processed result, for example, from processor 224.

Figure 3:
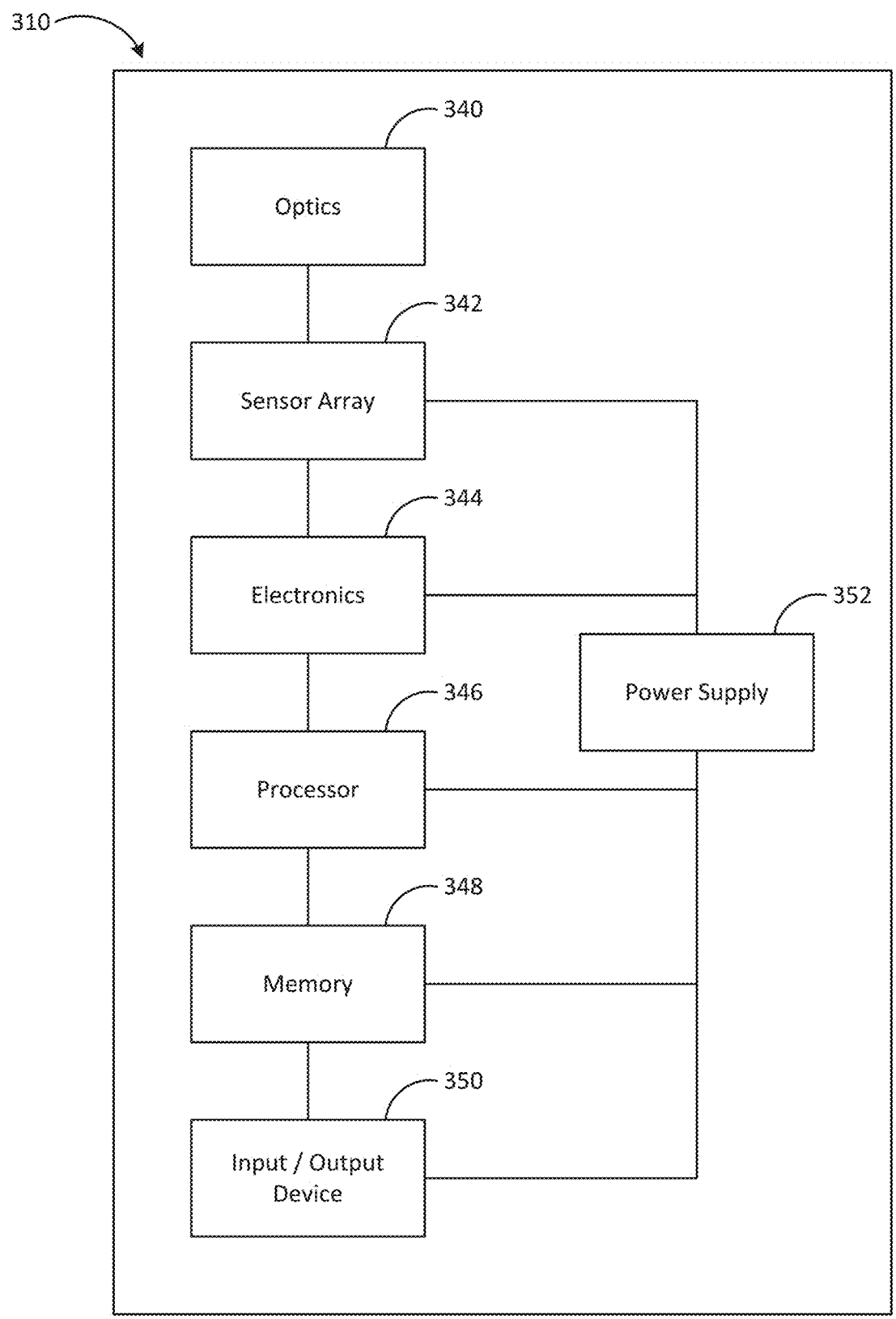
FIG. 3 shows an example block diagram of an imaging tool configured for receiving electromagnetic radiation according to some exemplary systems.

FIG. 3 shows an example block diagram of an imaging tool configured for receiving electromagnetic radiation according to some exemplary systems. In the illustrated embodiment, imaging tool 310 includes optics 340, a sensor array 342, electronics 344, one or more processors 346, memory units 348, input/output devices 350, and a power supply 352.

The optics 340 can include optics for focusing, deflecting, and/or reflecting electromagnetic radiation from a target object onto the sensor array 342. In some examples, the sensor array 342 may include an infrared sensor array sensitive to infrared radiation. An imaging tool including such an infrared sensor array may be used to make non-contact temperature measurements.

In such embodiments, the infrared sensor array 342 can include one or more thermal detectors such as microbolometers or thermopiles, or could be composed of photon detectors such as photodiodes or phototransistors, or other thermal or photon detection device. In some examples, an infrared sensor array may include a single detector, for instance, for determining a spot temperature within a target scene. Alternatively, an infrared sensor array may comprise a plurality of such detectors for acquiring at least one of a spot temperature (e.g., via an average value of sensor array sensors) and a two-dimensional infrared image.

One having ordinary skill in the art will recognize that various sensor arrays (e.g. photon sensor arrays) can be used, and can be used in combination with one or more infrared sensor arrays. In some examples, the sensor array is fixed within the imaging tool 310 to provide a more durable device having fewer moving and moveable parts. In various examples, the size and positioning of the detector depends on the characteristics of the optical system (e.g., the relationship between optics 340 and sensor array 342). In some embodiments, the detector is generally circular having a diameter of 0.5 mm to 3 mm. However detectors of any size and shape should be considered within the scope of the invention. The detector produces a signal as a function of the radiation or other scene data imaged thereupon. These signals can be processed by known methods to indicate a temperature or other metric indicated via the received radiation.

A person having ordinary skill in the art will recognize that many materials and materials technologies may be suitable for use in an infrared sensor array. In some examples, the infrared sensor array 342 responds to infrared radiation ranging from approximately 0.7 microns to approximately 30 microns and can have a peak sensitivity within this range. The electronics 344 receive the output signals from the sensor array 342 and pass them to the processor 346 for analysis.

When an infrared sensor assembly is used, the processor 346 can be used to run infrared thermometer applications including, but not limited to, deciding if the target object sufficiently fills the field of view, and averaging output signals for a period of time to reduce the impact of noisy measurements on the accuracy of the measured temperature. In the case of alternative sensor arrays (e.g., sensitive to one or more of visible light, ultraviolet light, X-rays, etc.), the processor 346 may be used to run corresponding imaging applications.

Memory 348 can include but is not limited to, RAM, ROM, and any combination of volatile and non-volatile memory. A power supply 352 can include, but is not limited to, a battery, a parasitic energy system (e.g., an inductive system), and components for directly receiving AC power. The power supply 352 can provide power to the sensor array 342, electronics 344, processor 346, memory 348, and/or input/output devices 350. An input/output device 350 can include, but is not limited to, triggers to start and stop the image capture, visual displays, speakers, and communication devices that operate through wired or wireless communications.

For instance, in some examples, the input/output device 350 of the imaging tool 310 can include a display capable of displaying an image produced from data conveyed or captured by one or more sensor arrays 342. In some examples, the display can be further configured to show other data, for instance, data from the test and measurement tool or other external sources. Additionally or alternatively, input/output device 350 may be capable of one or more of receiving measurement data from a measurement tool and communicating at least one of image data and received measurement data to an external device, such as a tablet, smartphone, computer, etc.

In some embodiments, the functionality of one or more components of one or both of the test and measurement tool 200 or imaging tool 310 can be shared between the components. For example, in some embodiments, a combination tool comprising a test and measurement tool and an imaging tool can include a processor capable of performing the processing functions of processor 224 and processor 346. Additionally or alternatively, a single memory in a combination tool can be capable of performing the functions of memory 226 and memory 348. Similarly, such a combination tool can include a single power supply, interface, or the like. In general, combination tools having both a test and measurement tool and an imaging tool can share any of a variety of components configured to interface with both the test and measurement tool and the imaging too.

As described elsewhere herein, in some examples, an imaging tool can be removably attached to a test and measurement tool to form a combination tool. In some such examples, one or both of the imaging tool and the test and measurement tool can include various components, such as a processor, memory, interface, display, and the like. Wired and/or wireless communication between the imaging tool and test and measurement tool can be used to communicate measurement data and/or image data between the tools. Several such configurations are described in U.S. patent application Ser. No. 14/855,884, which is incorporated by reference. Similarly, one or both of imaging tool and test and measurement tool can be in communication with an external device. The external device may include components such as memory, a processor, and/or a display. In various embodiments, such components can be used in addition to similar components in the test and measurement tool and/or the imaging tool, or can replace the functionality of such components. For instance, in some examples, image data and/or measurement data can be communicated to an external device for processing and/or display. Some such configurations are described in U.S. patent application Ser. No. 14/855,989, which is incorporated by reference.

In some embodiments, a test and measurement tool may be capable of measuring high voltages. Accordingly, in some instances, such high voltages may at times be present within circuitry (e.g., electronics 222) of the test and measurement tool. Standards and practices exist to protect users of typical test and measurement tools from being exposed to such high voltages. For example, one or both of solid state insulation and sufficient spacing between potentially high voltage portions of a test and measurement tool and location physically accessible to a user may provide protective electrical isolation to an operator.

For example, IEC 61010 standard for CAT III 1000V rated products requires approximately 16 millimeters spacing from components on which at high voltage could be present. Similarly, IEC 61010 can require different spacing for different voltage ratings. In some examples, the amount of spacing required can be reduced when solid materials (e.g., electrically insulating materials) are disposed between the potentially high voltage components and a user, such as an insulating casing of a test tool. In some examples, an electrically insulating casing of a test tool provides sufficient insulation between a user and potentially high voltage components internal to the test tool. In some embodiments, seams in the insulating casing are positioned that, even when tracing through the seams, the path length to any potentially high voltage component meets the required distance standard.

However, when an imaging tool is incorporated (e.g., built-in, removably attached, etc.) into a test and measurement tool capable of performing such high-voltage measurements, the imaging tool may provide a weak point in the protective insulating properties of the test and measurement tool. For example, insulating casings used in test tools are often too opaque to allow radiation of desired wavelengths to pass therethrough. Accordingly, in some such embodiments, the imaging tool at least cannot be fully surrounded by such an insulating material. Thus, an imaging tool that is in close proximity with or in communication with a potentially high voltage portion of a test and measurement tool, or is in communication with a common component (e.g., a processor, memory, etc.), may include components at dangerously high voltages.

In some configurations of a combination tool such as shown in FIGS. 1A and 1B, an imaging tool can be recessed into a housing of the combination tool so that the distance between the imaging tool and the exterior of the tool meets any electrical isolation requirements. As described, an imaging tool typically requires an opening in an insulating material to allow radiation to pass therethrough, for example, to reach one or more sensor arrays for generating image data. Thus, the combination tool can include an insulating casing including an opening to allow radiation to pass therethrough to reach a recessed imaging tool.

However, an opening in the insulating casing of the combination tool to allow radiation to pass therethrough may also allow a user to access the internal imaging tool, for example, with their finger. Such portions of the combination tool and/or the imaging tool providing a shock risk for the user even though the imaging tool itself does not necessarily require dangerously high voltages for operation.

In some embodiments, to minimize the risk of a user accessing a potentially high-voltage imaging tool, the opening may be sized so as to reduce the likelihood of a user's accessing parts of the imaging tool. For instance, in some embodiments, the opening is sized so that a user's finger is unlikely to reach to an unsafe distance from the imaging tool. For instance, in some examples, the opening in the imaging tool can be sized so that a typical-sized finger from reaching unsafe internal portions of the combined tool. For example, the International Electrotechnical Commission (IEC) provides dimensions for finger-sized probes in order to approximate the depth a finger may penetrate a structure. The opening can be configured so that such a "standard" finger, when inserted into the opening, is prevented from reaching a certain distance from any potentially high voltage components of the imaging tool.

Figure 4:
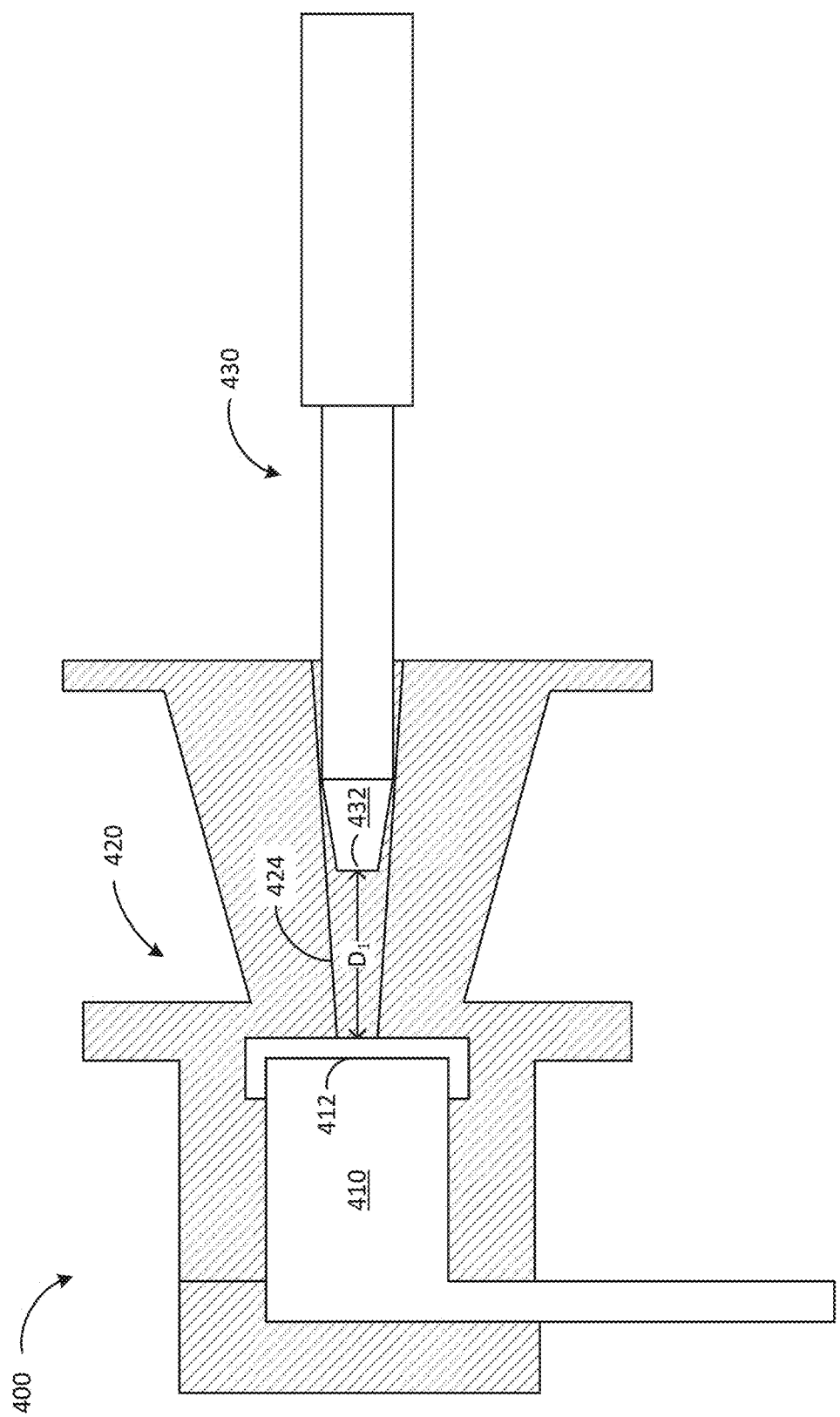
FIG. 4 shows a cross-sectional view of an exemplary imaging tool configured to reduce the risk of shocks from the imaging tool to the user.

FIG. 4 shows a cross-sectional view of an exemplary imaging tool configured to reduce the risk of shocks from the imaging tool to the user. In the illustrated example, imaging tool 410 is embedded in a combination tool 400. The imaging tool 410 is surrounded by an insulating coating 420 of the combination tool 400. The insulating coating 420 includes an insulating material (shown in a crosshatch pattern) having sufficient thickness to provide proper electrical isolation between the imaging tool 410 and a user handling the combination tool 400. It will be appreciated that the shape of the insulating coating is exemplary, and that many appropriate shapes are possible. In some embodiments, the combination tool 400 includes a housing substantially surrounding the insulating coating 420 to provide a convenient shape for holding by the user. In some such embodiments, the housing comprises insulating coating 420.

In the illustrated embodiment, the imaging tool 410 includes a receiving end 412 configured to receive electromagnetic radiation and to direct the received radiation to an imaging element such as a sensor array. The receiving end can include, for example, one or more lenses, filters, windows, or the like. The insulating coating 420 includes an opening 424 proximate the receiving end 412 of the imaging tool 410 for allowing electromagnetic radiation to pass therethrough and reach the receiving end 412 of the imaging tool 410.

In the illustrated embodiment, the opening 424 is shaped to limit the depth of penetration of the tip 432 of a finger 430 (e.g., a standard finger as defined by the IEC) into the opening. For example, in some configurations the opening 424 is angled so that the tip 432 of the finger 430 cannot get within a distance $D_1$ of the closest end (e.g., receiving end 412) of the imaging tool 410. In some examples, the distance $D_1$ is a minimum distance required to provide adequate isolation between the imaging tool 410 and the tip 432 of a finger 430 inserted as far into the opening 424 as possible.

The distance $D_1$ may depend on a variety of factors, such as one or more of the maximum voltage expected to be present or possibly present at the imaging tool 410, materials disposed between the imaging tool 410 and the tip 432 of finger 430, the standard of safety being applied (e.g., IEC standards), and the like. In an exemplary embodiment, the test and measurement tool of the combination tool 400 is capable of receiving voltages up to 1000V, and that the imaging tool 410 may similarly reach approximately 1000V relative to earth ground in some instances. Applying 1000V CAT III isolation according to IEC standards, distance $D_1$ may be approximately 16 millimeters (mm). That is, opening 424 may be sized/shaped so that the tip 432 of a standard finger 430 (i.e., a finger size/shape according to a standard such as the IEC) cannot come within 16 millimeters of the imaging tool 410 when fully inserted into the opening 424. In some examples, a minimum value for the distance $D_1$ is dictated by safety standards. For instance, in some embodiments, the distance $D_1$ is based on IEC 61010 safety standards. In some such examples, the actual distance $D_1$ can be dependent on the voltage rating of the tool combined with the IEC 61010 standard. That is, for example, a tool rated at fewer than 1000V may allow spacing that is less than 16 millimeters.

In various embodiments, imaging tool 410 may include a narrow field of view (e.g., via a lens or other optics) so that the insulating coating 420 proximate the opening 424 does not significantly block part of the field of view of the imaging tool 410. It will be appreciated that the diagram of FIG. 4 is exemplary and is intended to show the implementation of one or more design options. Unless otherwise stated, elements shown in FIG. 4, or other figures herein, are not necessarily drawn to scale or intended to show exact dimensions or configurations.

Figure 5:
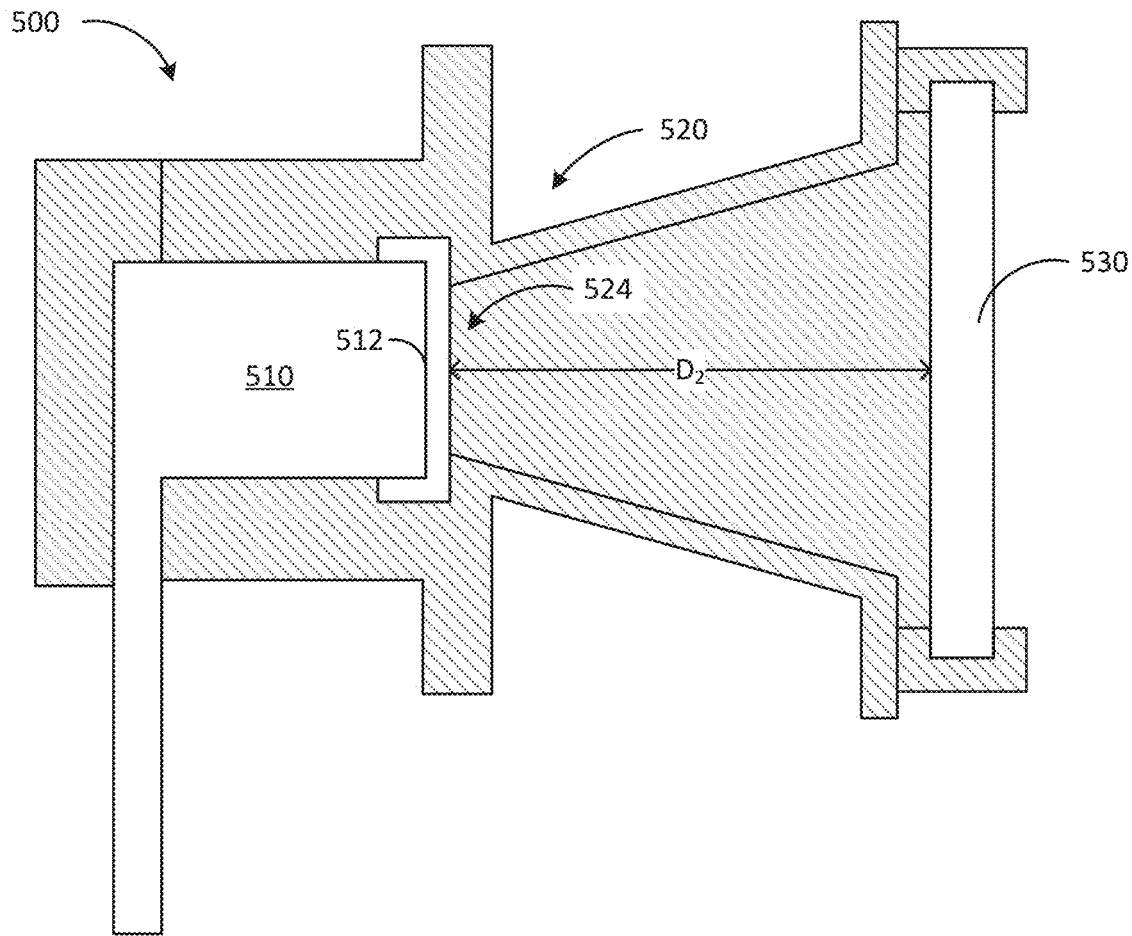
FIG. 5 shows a cross-sectional view of an alternative exemplary imaging tool in a combination tool configured to reduce the risk of shocks from the imaging tool to the user.

FIG. 5 shows a cross-sectional view of an alternative exemplary imaging tool in a combination tool configured to reduce the risk of shocks from the imaging tool to the user. In the illustrated example, combination tool 500 includes an imaging tool 510 embedded therein. The imaging tool 510 is embedded in an insulating coating 520 of the combination tool 500. The insulating coating 520 includes an insulating material (shown in a crosshatch pattern) having sufficient thickness to provide proper electrical isolation between the imaging tool 510 and a user handling the combination tool 500. As described elsewhere herein, the combination tool 500 can include a housing surrounding the insulating coating 520 and shaped for convenient grasping by a user. Additionally or alternatively, such a housing can include the insulating coating 520.

In the illustrated embodiment of FIG. 5, the imaging tool 510 includes a receiving end 512 configured to receive electromagnetic radiation and to direct the received radiation to an imaging element such as a sensor array. Similarly to the receiving end 412 of imaging tool 410, in some embodiments, the receiving end 512 can include one or more lenses, filters, windows, or combinations thereof. In some examples, receiving end need not include any additional components. Additionally or alternatively, the receiving end can include the imaging element, such as a sensor array.

The insulating coating 520 includes an opening 524 proximate the receiving end 512 of the imaging tool for allowing electromagnetic radiation to pass therethrough and reach the receiving end 512 of the imaging tool 510. In the illustrative embodiment of FIG. 5, the opening 524 is covered at a distal end by a window 530. In some examples, window 530 can effectively prevent a user from inserting an object (e.g., a finger) into the opening 524 and toward a potentially high voltage component of imaging tool 510. In some embodiments, the window 530 may be bonded or molded to the insulating coating 520 or other component, such as a housing surrounding the imaging tool 510. In various embodiments, the window 530 is rigidly secured over the opening 524 to deter objects from entering the opening 524 and potentially encountering the imaging tool 510. In such embodiments, the user is protected from high voltage inside the tool 500 by construction providing sufficient spacing and/or sufficiently insulative materials, including through all seams and edges including around the window 530.

In some examples, the window 530 is optically transmissive in one or more spectral regions detectable by the imaging tool 510, allowing the imaging tool 510 to receive radiation through the window 530. For instance, in some examples, an imaging tool (e.g., 510) may include a sensor array capable of detecting radiation in one or more spectral regions, such as infrared and/or visible light radiation. The imaging tool 510 can receive radiation in such spectral regions from a target scene and generate corresponding image data. As discussed elsewhere herein, in some embodiments, the imaging tool 510 can be capable of generating image data from different spectral regions, such as separate infrared image data and visible light image data. Window 530 may be made of a material capable of effectively transmitting wavelengths of radiation detectable by a sensor array of the imaging tool 510, such as infrared and/or visible light radiation. For example, in the case of an infrared imaging device, window 530 can include an infrared-transmissive material, such as germanium.

In the illustrated embodiment, the window 530 is positioned a distance $D_2$ from the receiving end 512 of the imaging tool 510. The distance $D_2$ may be determined based on a minimum distance to meet a certain isolation standard, such as a 1000V CAT III isolation standard, to provide sufficient electrical isolation between a user and the imaging tool 510. Additionally or alternatively, the distance $D_2$ can depend on the material of window 530. For example, if window 530 comprises a substantially electrically insulating material, the distance $D_2$ required to provide sufficient isolation may be less than if the window 530 comprises an electrically conductive material. In some embodiments, the window does not provide sufficient insulation to protect a user from a high voltage at the imaging tool 510. Accordingly, distance $D_2$ may be at least the distance required to provide sufficient electrical isolation between a user and the imaging tool 510 without a window present (e.g., similar to the distance $D_1$ in FIG. 4). More insulating materials used as window 530 may allow a shorter distance to provide similarly effective isolation. That is, in some examples, an electrically insulating window 530 may provide additional protection to a user so that the minimum safe distance for a user of the tool 500 of FIG. 5 can be less than that for a user of tool 400 of FIG. 4. Thus, according to some embodiments in which window 530 is at least partially electrically insulating, imaging tools 410 and 510 of FIGS. 4 and 5, respectively, can be operated with reduced risk of shock to an operator, wherein $D_2$ and $D_1$ are minimum safe operating distances and $D_2 < D_1$.

As described elsewhere herein, the presence of window 530 may prevent a user from inserting an object (e.g., a finger) into the opening 524. Thus, in such instances, a user may be sufficiently protected from the imaging tool 510 without restriction on the size or shape of the opening 524.

As discussed elsewhere herein, in the embodiments, the imaging tool 510 comprises an infrared camera module sensitive to infrared radiation and capable of generating infrared radiation. In some such embodiments, the thermal profile of the window 530 may lead to errors in generated infrared image data. That is, infrared radiation from the window 530 can be detected by the imaging tool and undesirably be incorporated into generated thermal image data.

In some cases, errors are caused by and/or compounded by temperature discrepancies between the imaging tool 510 and the window 530. Accordingly, in some examples, portions of the electrically insulating coating 520 may comprise a thermally conductive material. A thermally conductive material may place the imaging tool 510 and the window 530 in substantial thermal equilibrium and reduce errors in infrared image data due to window temperature offsets. Additionally or alternatively, portions of one or both of the imaging tool 510 and the window 530 can be thermally isolated from other system components, particularly those which may act as heat sources to alter the temperature of the imaging tool 510 or window 530. For example, thermally isolating materials may be placed between one or both of the imaging tool 510 and the window 530 and a power source or other powered component that may generate heat.

The examples illustrated in FIGS. 4 and 5 show exemplary methods for embedding an imaging tool into a test and measurement tool so that, if the imaging tool is at high voltage, a user is substantially protected from electrical shock from the imaging tool and test and measurement tool. As described elsewhere herein, an embedded imaging tool can be fixedly integrated with a test and measurement tool to form a single combination tool. In other embodiments, a modular combination tool can include an imaging tool that may be removably attached to the test and measurement tool. For instance, the test and measurement tool may be configured to receive the imaging tool such that, once combined with the test and measurement tool, any potentially high voltage portions of the imaging tool are electrically isolated from a user.

It will be appreciated that the exemplary configurations shown in FIGS. 4 and 5 are illustrative in nature. Components in FIGS. 4 and 5 are not necessarily drawn to scale unless otherwise specified. While certain aspects of the figures (e.g., distances $D_1$, $D_2$) may be shown as meeting certain standards (e.g., IEC 61010 standards), such aspects can be achieved in a variety of ways. Additionally or alternatively, the shapes and sizes of other portions of the tool (e.g., the shape and/or size of the insulating coating surrounding the imaging tool, the imaging tool itself, etc.) may vary without departing from the scope of the disclosure.

While the embodiments of FIGS. 4 and 5 provide electrical isolation between a user and the imaging tool by embedding the imaging tool within electrical isolation (e.g., insulating coating), other ways of safely operating an imaging tool communicating with a test and measurement tool are possible, such as described, for example, in U.S. Provisional Application No. 62/219,415, which is incorporated by reference, and U.S. patent application Ser. No. 15/262,820, filed Sep. 12, 2016, and entitled "ELECTRICAL ISOLATION FOR A CAMERA IN A TEST AND MEASUREMENT TOOL," which is assigned to the assignee of the instant application and is incorporated herein by reference in its entirety. In some such embodiments, the imaging tool may itself be electrically isolated from portions of the test and measurement tool. In such embodiments, even if portions of the test and measurement tool are at a high voltage, the imaging tool may remain safe to the touch and need not be isolated from a user.

Various examples have been described. These and other examples are within the scope of the following embodiments.

The invention claimed is:

1. An analysis system comprising
a test and measurement tool comprising a test and measurement circuit configured to interface with a device under test and to generate measurement data representative of at least one parameter of the device under test, the test and measurement circuit being configured to electrically connect with the device under test to perform measurements at high voltages;
an imaging tool attached to the test and measurement tool and configured to receive electromagnetic radiation from a target scene and to generate image data representative of the target scene, the imaging tool comprising a sensor array and a receiving end having a lens configured to receive electromagnetic radiation from the target scene and to direct the received electromagnetic radiation to the sensor array;
a housing enclosing the test and measurement tool, including the test and measurement circuit, and the imaging tool, the housing comprising an aperture for permitting electromagnetic radiation to enter the housing so that the imaging tool receives the electromagnetic radiation, the housing comprising an insulating coating surrounding at least a portion of the imaging tool, the insulating coating having an opening proximate the imaging tool such that electromagnetic radiation can enter the opening and reach the imaging tool;
a processor in communication with the test and measurement circuit of the test and measurement tool and the imaging tool and configured to receive and process measurement data and image data; and
a window separate from the receiving end of the imaging tool and covering the opening in the insulating coating proximate the imaging tool, the window being positioned at least a first distance from the receiving end of the imaging tool; wherein
the window covering the opening in the insulating coating of the housing prevents a user from accessing the lens of the imaging tool within the housing via the aperture in the housing; and
the first distance being associated with electrical characteristics of the window and a voltage rating of the test and measurement circuit so that a user operating the analysis system is electrically isolated from the test and measurement circuit through the imaging tool at least to the voltage rating of the test and measurement circuit via the window and the at least first distance between the window and the receiving end of the imaging tool.

2. The analysis system of claim 1, wherein the imaging tool comprises an infrared camera module, and wherein the window comprises an infrared-transmissive material.

3. The analysis system of claim 2, wherein the imaging tool further comprises a visible light camera module, and wherein the window is transparent to visible light.

4. The analysis system of claim 1, wherein the window is in thermal communication with a thermally conductive portion of the electrically isolating material.

5. The analysis system of claim 1, wherein the imaging tool is removably attached to the test and measurement tool.

6. An analysis system comprising:
a test and measurement tool comprising a test and measurement circuit configured to interface with a device under test and to generate measurement data representative of at least one parameter of the device under test, the test and measurement circuit being configured to electrically connect with the device under test to perform measurements at high voltages;
an imaging tool attached to the test and measurement tool and configured to receive electromagnetic radiation from a target scene via a receiving end of the imaging tool and to generate image data representative of the target scene, the imaging tool being electrically coupleable to the test and measurement circuit of the test and measurement tool;
a housing comprising an insulating material at least partially surrounding the imaging tool and the test and measurement circuit, the insulating material having an aperture proximate the receiving end of the imaging tool and the housing being configured to prevent a user from accessing a portion of the imaging device within the housing; wherein
the housing comprises a frustoconical opening shaped and sized to prevent a standard finger from reaching within a predetermined distance of the receiving end of the imaging tool.

7. The analysis system of claim 6, wherein the imaging tool is fixedly attached to the test and measurement tool.

8. The analysis system of claim 6, wherein the receiving end of the imaging tool comprises a wide angle lens.

9. The analysis system of claim 6, wherein the test and measurement tool comprises a digital multimeter.

10. A combination tool comprising:
a test and measurement circuit configured to interface with a device under test in order to measure at least one electrical parameter of the device under test, the test and measurement circuit being configured to electrically connect with the device under test to perform measurements at high voltages;
an imaging tool fixedly attached to and in electrical communication with the test and measurement tool, the imaging tool being configured to generate image data representative of a target scene and comprising a sensor array and a receiving end having a lens configured to receive electromagnetic radiation from the target scene and to direct the received radiation to the sensor array;
a housing comprising an insulating material and surrounding at least a portion of the test and measurement circuit and the imaging tool, the housing having an opening proximate the imaging tool so that electromagnetic radiation from the target scene travels through the opening in the housing and is received by the imaging tool; and
a window separate from the receiving end of the imaging tool and covering the opening in the housing proximate the imaging tool and the lens positioned at the receiving end of the imaging tool so that a user cannot access the lens of the imaging tool via the opening in the insulating coating; wherein
the window prevents a standard sized finger from accessing a position within a predetermined distance from the imaging tool via the opening, the predetermined distance being associated with electrical characteristics of the window and a voltage rating of the test and measurement circuit so that a user operating the analysis system is electrically isolated from the test and measurement circuit through the imaging tool at least to the voltage rating of the test and measurement circuit via the window and the at least predetermined distance between the window and the receiving end of the imaging tool.

11. The combination tool of claim 10, wherein the imaging tool comprises an infrared camera module and the window comprises an infrared-transmissive material.

12. The combination tool of claim 10, wherein the window is in thermal communication with a thermally conductive portion of the insulating material of the housing.

13. The analysis system of claim 6, wherein the standard finger and the predetermined distance meet International Electrotechnical Commission (IEC) 61010 standards.

* * * * *